(12) United States Patent
Basu et al.

(10) Patent No.: US 10,439,553 B2
(45) Date of Patent: Oct. 8, 2019

(54) METHOD AND SYSTEM OF FAULT DETECTION AND LOCALIZATION IN DC-SYSTEMS

(71) Applicant: EmaZys Technologies, ApS, Vejle (DK)

(72) Inventors: Ronni Basu, Odense NV (DK); Anders Rand Andersen, Odense M (DK); Peter Husen, Odense C (DK); Daniel Hamkens, Odense C (DK)

(73) Assignee: EMAZYS APS, Odense M (DK)

( * ) Notice: Subject to any disclaimer, the term of this patent is extended or adjusted under 35 U.S.C. 154(b) by 296 days.

(21) Appl. No.: 15/326,779

(22) PCT Filed: Jul. 10, 2015

(86) PCT No.: PCT/DK2015/050215
§ 371 (c)(1),
(2) Date: Jan. 17, 2017

(87) PCT Pub. No.: WO2016/008497
PCT Pub. Date: Jan. 21, 2016

(65) Prior Publication Data
US 2017/0214362 A1 Jul. 27, 2017

(30) Foreign Application Priority Data
Jul. 18, 2014 (DK) .................................. 2014 70457

(51) Int. Cl.
*H02S 50/10* (2014.01)
*G01R 31/08* (2006.01)

(52) U.S. Cl.
CPC .............. *H02S 50/10* (2014.12); *G01R 31/08* (2013.01)

(58) Field of Classification Search
CPC ................................ H02S 50/10; G01R 31/08
(Continued)

(56) References Cited

U.S. PATENT DOCUMENTS

| 4,142,409 A * | 3/1979 | Miura | B65H 59/40 |
| | | | 336/30 |
| 4,694,247 A * | 9/1987 | Meili | G01N 27/84 |
| | | | 324/216 |

(Continued)

FOREIGN PATENT DOCUMENTS

| EP | 2019433 A1 | 1/2009 |
| JP | 2001024204 A | 1/2001 |

(Continued)

OTHER PUBLICATIONS

International Search Report for corresponding application PCT/DK2015/050215 filed Jul. 10, 2015; dated Oct. 7, 2015.

(Continued)

*Primary Examiner* — Giovanni Astacio-Oquendo
(74) *Attorney, Agent, or Firm* — Cantor Colburn LLP

(57) ABSTRACT

This disclosure relates to a method of and a system for fault detection and localization of a fault in a DC-system comprising multiple serially connected DC-sources. The method may comprise an act of connecting a test apparatus to at least one terminal of the DC-system and to DC-system ground. The method encompasses at least one repetition of an act of applying a test AC-signal to one terminal of the DC-system, an act of detecting the response AC-signal to the test AC-signal on either one terminal alone and/or on DC-system ground; and an act of comparing the test AC signal with the response AC-signal to detect a fault and the location of the fault in the DC-system. The system comprises a fault detection and localization apparatus configured to perform the method disclosed.

19 Claims, 11 Drawing Sheets

(58) Field of Classification Search
USPC .................................. 324/649, 57, 408, 679
See application file for complete search history.

(56) References Cited

U.S. PATENT DOCUMENTS

| | | | | |
|---|---|---|---|---|
| 4,866,379 | A | * | 9/1989 | Odagawa ................. G01C 9/00 324/207.12 |
| 7,130,680 | B2 | * | 10/2006 | Kodama .............. A61B 5/0537 600/547 |
| 2005/0286185 | A1 | * | 12/2005 | Henson ................ H02H 1/0015 361/42 |
| 2012/0174961 | A1 | | 7/2012 | Larson |
| 2013/0120017 | A1 | | 5/2013 | Hopf |
| 2014/0117999 | A1 | | 5/2014 | Shigemura |
| 2018/0045783 | A1 | * | 2/2018 | Wu .................... G01R 31/3277 |
| 2018/0048138 | A1 | * | 2/2018 | Macerini .............. H02H 1/0015 |

FOREIGN PATENT DOCUMENTS

| | | |
|---|---|---|
| JP | 2008091828 A | 4/2008 |
| JP | 2011035000 A | 2/2011 |
| JP | 2012169531 A | 9/2012 |
| JP | 2012238716 A | 12/2012 |
| JP | 2012256771 A | 12/2012 |
| JP | 2013069974 A | 4/2013 |
| JP | 2013138133 A | 7/2013 |
| JP | 3186061 U | 9/2013 |
| JP | 2014033184 A | 2/2014 |
| JP | 2014514582 A | 6/2014 |
| WO | 2012152284 A1 | 11/2012 |
| WO | 2013149960 A1 | 10/2013 |

OTHER PUBLICATIONS

Takumi Takashima, "Experimental Studies of Failure Detection Methods in PV Module Strings", Conference Record of the 2006 IEEE 4th World Conference on Photovoltaic Energy Conversion, May 1, 2006, pp. 2227-2230, XP0310007789.

* cited by examiner

A

B

METHOD AND SYSTEM OF FAULT DETECTION AND LOCALIZATION IN DC-SYSTEMS

FIELD OF THE INVENTION

The present invention relates to a method of and a system for fault detection and localisation of a fault in a DC-system comprising multiple serially connected DC-sources.

The method may comprise an act of connecting a test apparatus to at least one terminal of the DC-system and to DC-system ground (GND). The method encompasses at least one repetition of an act of applying a test AC-signal to the least one terminal of the DC-system, an act of detecting the response AC-signal to the test AC-signal on either one terminal alone and/or on DC-system GND; and an act of comparing the response AC signal with the test AC-signal to detect a fault and the location of the fault in the DC-system.

The system may comprise a fault detection and localisation apparatus configured for detection and localisation of a fault in a DC-system comprising multiple serially connected DC-sources. Such fault detection and localisation apparatus or test apparatus may comprise a connector configured to connect the apparatus to at least one terminal of the DC-system and to DC-system GND; an AC-source configured to generate a test AC-signal and configured to apply the test AC-signal to the connector; a detector configured to detect the response AC-signal to the applied test AC-signal; a comparator configured to compare the test AC-signal and the response AC-signal by means of impedance spectroscopy; a central processing unit in charge of storing and analysing the results of at least one measurement and to output the result of the detection of a fault and the location of the fault in the DC-system.

BACKGROUND OF THE INVENTION

Fault detection and localisation of fault or fault in a DC system with multiple DC-sources is an important skill to maintain power systems and to operate such systems optimally. However, DC systems may in reality become complex systems when assembled and during operation. The task of fault finding easily becomes complex and assumed faults and their localisation in a system may when the actual component is found and inspected turn out not to be faulty or located where expected. Likewise fault localisation may be very time consuming if not practically unfeasible or even impossible if each source is to be tested individually.

In particular, DC-systems may during installation be installed with deviations from the intended installation and faults may be introduced. Likewise a DC-system may become damaged or degenerate over time with a huge number of combinations of possible faults.

DC-systems may include Photo Voltaic (PV) systems, battery systems, fuel cell system or hybrids thereof or similar arrangements characterised in having multiple sources arranges in series.

Patent application WO2012152284 generally discloses a method for diagnosing a fault within solar cell systems including multiple solar cell modules. Part of WO2012152284 also discloses a method for fault localisation and determining the fault type. However, the fault localisation procedure requires use of additional setup including a DC BIAS. Also the method requires analysis of the measurement in a different domain (time domain reflectometry), which adds complexity to the procedure.

Prior art including the patent application WO2012152284 is also limited in a further aspect by suggesting use of systems or methods that need to be individually configured or applied. Thus, although individual faults may be detected and localized, different apparatuses or methods must be connected, disconnected or reconfigured to accomplish measurements. Thus, there is a need for a more integrated apparatus or procedure that can ease detection and localisation and even improve detection and localisation by allowing combined assessments. Hence, a single device or approach to catch a multitude of different but a-priori unknown but albeit detectable faults is desired.

OBJECTIVE OF THE INVENTION

It is an objective of this disclosure to overcome the shortcomings of the prior art. It is a further objective to disclose features of fault detection and localisation that are important in real world situations where the power systems may have complexities and be exposed to faults that in hindsight when found, could be derived, but when not known a priori would be very difficult to find without a robust methodology or appropriate equipment, including choice of model.

Although prior art has disclosed use of impedance measurements for constructed faults in simple laboratory settings there is a need for a practical solution that will be operable and work in the field.

Prior art may have focused on identifying a particular fault and provided a method and system for that. However fault detection and fault localisation in practice would improve by a method and a system that can provide reliable results that are—at least sufficient—to distinguish a plurality of faults.

DESCRIPTION OF THE INVENTION

An objective of the invention is achieved by a method of fault detection and localisation of a fault in a DC-system comprising multiple serially connected DC-sources. The method may comprise an act of connecting a test apparatus to at least one terminal of the DC-system and to DC-system ground.

The method encompasses at least one repetition of an act of applying a test AC-signal to the least one terminal of the DC-system, an act of detecting the response AC-signal to the test AC-signal on either one terminal alone and/or on DC-system ground; and an act of comparing the response AC signal with the test AC-signal to detect a fault and the location of the fault in the DC-system.

Thereby, a robust procedure and reliable procedure is disclosed.

If there are no ground faults, a prior art LCR meter could be safely connected to the anode or cathode and ground terminals. However such assumption or elimination of ground faults will complicate and disturb the fault detection. This is relevant since most DUT's (Device Under Test) will have shown some faulty behaviour before the diagnostic or service operations are carried out. By applying the disclosed procedures ground faults have systematically been taken care of and real faults have reliably been detected and located on a regular basis in field cases.

If a ground fault is present, the test apparatus and use thereof according to prior art type in general may be at risk of yielding ambiguous results, at risk of being destroyed and even bringing the operator at risk.

Although this procedure may appear simple, diligent use in all acts is required to eliminate—sufficiently—errors and false positives by providing results about faults and their locations that are reliable or at least better than previously known methodologies.

As such, applying the disclosed method yields results that are generally of such quality that a plurality of faults can be distinguished and their location determined.

It has to be remembered that the alternative is to inspect each DC-source individually or getting false positives or simply unclear results. In a DC-system, say a PV-array or a PV-string, there may be hundreds or even thousands of individual sources of solar PV cells. Getting reliable results that will reduce the task to perhaps tens of sources is a major achievement. A person skilled in the art will appreciate that the outlined method is scalable and may be applied to parts, subparts etc. of a DC-system under test as a DUT.

By doing so, it has been shown that the procedure yields reliable detection and localisation of faults. Detection and localisation of faults has been shown to be more precise and easier to perform than otherwise.

According to an aspect of the method, act of comparing involves usage of impedance spectroscopy.

To perform the impedance spectroscopy, the act of detecting involves performing a measurement that is suited for impedance spectroscopy. Such measurement may be referred to as an impedance measurement, which may be performed by using a sufficiently fast analogue to digital sampler.

This may be performed by a processor such as a central processing unit (CPU) in charge of storing and analysing the results of at least one measurement.

In practice fault detection and positioning may involve more than one measurement configuration.

Impedance spectroscopy is understood to encompass acts of signal processing, data analysis and mathematical modelling and impedance spectroscopy may be performed as disclosed in WO2012152284, all of which content is hereby incorporated by reference.

The method may involve repetitive acts of performing one or more measurements on one or more configurations. Such method may involve multiple measurements on multiple configurations.

The disclosed method may involve the measurement of a full impedance spectrum i.e. not just impedance measurement at a single frequency.

If a full spectrum is recorded when measuring the impedance then the comparison or analysis becomes more precise due to a more accurate or reliable (less influenced by artefacts and systematic influences) determination of the impedance.

This allows the recorded data to be validated thereby increasing the accuracy of the measurement. If something is systematically influencing the impedance, while the needed measurements are carried out, the precision of the localisation may be negatively affected. Precision with respect to localisation is the essential feature of the system, and the method thus provides a non-trivial way to ensure this.

When a full spectrum of AC frequencies is recorded, Kramers-Kronig relations may be applied to study if the impedance measurement has been influenced by error such as instrument artefacts, noise or time dependent phenomena. Kramers-Kronig mathematical relations are not meaningful for analysing measurements at just a single frequency.

According to an aspect of the method, the act of connecting involves applying a load to the DC-system.

According to an aspect of the method, the load is a weak load.

A weak load may have an upper limit so as to result in a "non-destructive load" and may be obtained as a result of characterizing the DC-system (under test).

Although not limited to this, but to exemplify the advantage of having a load or a weak load there is the case of detecting correct functionality of a bypass diode (BPD) using impedance spectroscopy in a PV string. In such case where partial shading is a fault, it is important that a small DC current is drawn from the terminals of the PV string. This current should be big enough to fully turn on a BPD protecting the PV cells that are being shaded. Typically, a current in the range of 10 mA-100 mA is used. This current should also be large enough that a sufficient DC voltage drop develops across the shaded PV cells in order to turn the BPD ON.

The range 10 mA-100 mA is a non-exclusive range for e.g. PV-systems and a standard test apparatus may reflect a current resulting from a weak-load.

Here, the resistance of an individual PV cell under dark conditions becomes an important parameter. For healthy cells, this resistance is larger than several tens of ohms, but it is a value that can lower over the cause of time e.g. due to potential or thermally induced degradation (PID and TID, respectively) and is also dependent on cell temperature.

It is therefore advantageous to ascertain whether the DC current drawn by the weak load is large enough to ensure that the voltage across any shaded string of cells is large enough to turn on its associated BPD. This can be done by measuring the unloaded impedance of the PV string under daylight conditions and with a known number of PV cells in a PV panel fully shaded. Here, it is also of importance to note that there can be large variations from cell to cell in systems that have been subject to ageing over several years. Here, it is often seen that the semi-conducting barriers in some cells can be entirely destroyed basically acting as shorts regardless of the illumination intensity. When estimating the impedance of shaded cells it is therefore advantageous to shade a significant number of cells (say 20-50 cells or more in say a 100-1000 cell system), so that the resulting measured impedance per cell is representative of the average cell impedance in the entire string of modules.

Thus, having a load or a weak load in the sense of a load sufficient to fully turn on a by-pass diode has been found to enable reliable detection of faulty BPDs.

This can be generalized to be applicable to any similar semiconductor or discrete component with similar characteristics.

According to a further aspect, the method comprises acts of characterising the DC-system and determining the load based on the result of characterising the DC-system, which determined load when used is non-destructive.

Thereby acts determining a suitable load that is large enough to induce the desired effect and at the same time small enough not to introduce errors (including artefacts) into the measurements.

According to a further aspect, the method comprises an act of stopping at least one of the serially connected DC-sources.

The procedures and methodology accounted for has shown to allow for an efficient way of locating faults.

In an embodiment an act may be to adjust the procedure until at certain known fault is detectable or distinguishable before performing the repetition of stopping a source.

The stopping may be performed in a divide-and-conquer fashion so that sections of a system can be diagnosed.

By a "divide-and-conquer" fashion is understood a procedure or an algorithm of breaking down a string with N-elements by subdividing the string/substring "recursively". Such approach reduces the complexity of performing a localisation of a fault requiring Log(N)-steps, which is more efficient than "linear" search which may take N-steps.

According to a further aspect, the act of connecting involves usage of a capacitive coupling between the test apparatus and the DC-system.

It has been found that in order to find the impedance of the DC-system, the contribution to the measured impedance from the coupling or interface must be understood, accounted for or even eliminated or removed.

According to a further aspect, the test AC-signal has frequencies ranging from a few Hz to several MHz. According to a further aspect, the test AC-signal is a swept frequency.

According to a further aspect the repetition is performed automatically by the test apparatus in periodical slots or in synchronized time slots.

This allows the tests to be performed by one person. In an embodiment the time slots may be remotely controlled by the inspector. In another embodiment the time slots are predetermined and tabulated and made available to the operator. Alternatively the tests are performed by a trigger arrangement.

According to a further aspect, the DC-system is a PV-system and the DC-source is a PV-unit and wherein the act of stopping a single PV-unit comprises the act of blocking light from the PV-unit.

In an embodiment the serial connected sources are solar panels. Here the blocking of power production may be performed by placing a shade on the solar panel one by one. Each time a new impedance measurement is performed. Placing the shadow over a module where for example a diode is defective will very clearly be indicated in the impedance spectroscopy result. Therefore, for each panel it is possible to place the shadow over the panel, perform an impedance test and continue to the next panel. In this way a rather large system, maybe comprising several strings of serially connected solar panels can be tested quickly. The shade may be by a flat panel having a low weight of 1-5 kg. The shade can be placed on a telescopic structure, so it is possible from the ground to cover roof-placed solar panels one by one by a shadow.

A specific objective is achieved by using a method as disclosed where the detection and localisation of a fault is of a semiconductor fault. The faulty semiconductor may be a faulty diode, which faulty diode may be a BPD type.

BPDs are essential safety arrangements in PV systems. If the BPD is not active, individual cells in a panel may start to dissipate power. This happens when the voltage across the cell is reversed, which can be caused by shading or other phenomenon. By tracking down faulty BPDs it becomes possible to prevent production losses and fire hazards.

A specific objective is achieved by using a method as disclosed where the detection and localisation of a fault is of a connection fault. The connection fault may be a disconnection or a switch fault or switching fault. The connection fault may be due to corroded connectors or junction box assemblies.

It is highly relevant to find disconnect faults, since such a fault will take out production entirely. A clear disconnect is thus a type of fault that has the highest possible priority with respect to service and maintenance. The localisation of the disconnection is essential for speeding up the service process thus supporting the system economy.

A specific objective is achieved by using a method as disclosed where the detection and localisation of a fault is of a ground fault or earth fault.

Ground faults are essential sources of hazards in PV systems, and they must be avoided. Often a circuit interrupter will be activated in the case of a grounding fault and this means that production is stopped until the fault is corrected. Grounding faults are in nature difficult to locate and rarely can they be seen with the naked eye, when the panels are accessible.

A specific objective is achieved by using acts of connecting terminals for performing and combining voltage measurements ($V_+$, $V\_V_G$) across all connected terminals of the DC-system and comparing the measurements by acts of impedance spectroscopy measurements.

Thereby it is possible to assess the distributed nature of a ground leakage in a given system, which system may be a PV system. It is furthermore possible to establish a function or a measure to determine, if the leakage is dominated by one or a single leakage channel. A person skilled in the art will be able to establish such function or measure to distinguish between the more single or more distributed nature of the leakage.

A specific objective may further be advanced by using acts of performing the voltage measurements ($V_+$, $V\_V_G$) using individually configurable resistors, say $R_1$ and $R_2$, arranged between the positive and negative terminals and in between a test resistor, say $R_{TEST}$, to instrument ground.

The configurable resistors $R_1$, $R_2$ may even be varied automatically.

Thus, by using a method as disclosed where the detection and localisation of a fault comprise acts of connecting terminals over multiple individual DC-source and combining individual voltage measurements ($V_+$, $V\_V_G$) a location of a fault can be established.

An objective of the invention is achieved by a fault detection and localisation apparatus configured for detecting a fault in a DC-system comprising multiple serially connected DC-sources. Such fault detection and localisation apparatus or test apparatus may comprise a connector configured to connect the apparatus to at least one terminal of the DC-system and to DC-system ground; an AC-source configured to generate an test AC-signal and configured to apply the test AC-signal to the connector; a detector configured to detect the response AC-signal to the applied test AC-signal a comparator configured to compare the test AC-signal and the response AC-signal by means of impedance spectroscopy and to output the result the detection of a fault and the location of the fault in the DC-system.

The detector may include means for measuring impedance, which means may be a sufficiently fast analogue to digital sampler.

The system may comprise a processor such as a central processing unit (CPU) in charge of storing and analysing the results of at least one measurement.

The system may also be configured to perform fault detection and positioning that involve more than one measurement configuration.

The system may be configured to perform impedance spectroscopy, which is understood to encompass means configured for signal processing, data analysis and mathematical modeling.

The impedance spectroscopy may be configured as disclosed in WO2012152284, all of which content is hereby incorporated by reference.

According to an aspect, the fault detection and localisation apparatus may further be configured with a load. The load may be a weak load. The load may be a non-destructive load obtained as a result of characterising the DC-system.

According to an aspect, the fault detection and localisation apparatus may further be configured with an electronic interface with at least one switch in a multiplexer configuration to apply test AC-signals and receive response AC-signals.

According to an aspect, the fault detection and localisation apparatus may further be configured with a switch configured to disconnect all terminals and the apparatus configured to self-test the sources of the test AC-signal, the detector and/or to self-test the comparator.

According to an aspect, the fault detection and localisation apparatus may further be configured with the connector comprising coupling capacitors that provide a capacitive coupling type of coupling of terminals to a DC-system.

A person skilled in the art will appreciate the requirements of the fault detection and localisation apparatus in terms of functionality as required by the disclosed method and thereby configure the fault detection and localisation apparatus accordingly.

Moreover, in an embodiment the apparatus may be a battery operated mobile impedance measurement apparatus, or the method performed may be using such mobile apparatus.

The impedance testing may be carried out in a frequency window that can be disturbed by noises from the voltage grid (e.g. 50 Hz and harmonics of 50 Hz), if energy is exchanged between the apparatus and the grid.

For this reason the apparatus may advantageously be powered by a battery voltage supply or a fuel cell. This reduces or even solves all issues related to grid noise, while also allowing the apparatus to be mobile. This has high practical relevance since DC generators tend to be placed highly decentralized e.g. on rooftops and rural areas. The battery operated impedance measurement apparatus thus becomes highly practical in that it allows noise free measurements in the field due to the fact that only a single person can carry it.

In one embodiment the apparatus may be configured with a man-machine-interface, "MMI", based on wireless communication via a remote control unit, and the remote control may have a significant memory integrated so that data may be stored, retransmitted and applied to optimise the performance of the apparatus.

The apparatus may be adapted to connect to a network such as a local area network or the Internet. The apparatus may further be adapted to transmit data via the network and distribute data via a server. The apparatus may be adapted for operation by a remote control either as a dedicated controller or as an applet (app) on a hand-held device such as a smartphone, tablet or portable computing device.

An object may be achieved by a fault detection and localisation apparatus for detection and localisation of a fault in a DC-system comprising multiple serially connected DC-sources, the fault detection and localisation apparatus comprising:
  a connector configured to connect the apparatus to at least one positive terminal and one negative terminal of the DC-system and to DC-system ground (16);
  an AC-source configured to generate an AC-test signal and configured to apply the AC-test signal to the connector;
  a detector configured to detect the response AC-test-signal to the applied test-signal;
  a comparator configured to compare the response test-signal and the test-signal (22) and to output the result of the detection of a fault and the location of the fault in the DC-system,
  an electronic interface with at least one switch in a multiplexer configuration to apply test signals and receive response AC-test-signal from all permutations of at least two of the terminals.

Thereby the apparatus is capable of performing a multitude of fault detections and localisation as a single device, since the electronic interface provides a non-trivial solution, real-world fault detection and characterisation. The apparatus will be able to easily switch between test methods required to catch a multitude of different but a-priori unknown but albeit detectable faults. The faults may require configurations, different analytical methods or procedures, but the interface allows for those configurations, methods or procedures to be applied correctly or more effectively.

The interface may be a separate unit or integrated with the connections.

In particular there may be three connection terminals for the connection between instrument and the positive (DUT+) and negative (DUT−) terminals of the device-under-test (DUT) and also its ground reference (DUT_GND). There may be several electronic or mechanical switches arranged in a multiplexer configuration to enable a sequence of impedance measurements between two out of three connected terminals of DUT without manual assistance. This may allow that the following three measurement permutations should be available through the multiplexing electronics: First; between DUT+ and DUT−, second; between DUT+ and DUT_GND and third; between DUT− and DUT_GND.

Furthermore, the multiplexer may allow for a disconnection of measurement electronics from DUT terminals entirely to allow for the conduction of self-test procedures in order to verify correct instrument HW and SW.

Furthermore, AC-coupling capacitors and other components ensure a small coupling impedance in terms of applied AC signals from an impedance spectroscopy circuitry and to shield same circuitry against the generally high DUT terminal voltages in the range of +/−1000V and the transient currents charging and discharging the coupling capacitors.

There may be independently configurable resistors that may be configurable, and in the range 100 kOhm-10 MOhm or in the order of MOhms, attached between the DUT terminals and the instrument ground and circuitry for the measurement of the DC voltages across these resistors.

There may be a configurable resistive load across the DUT+ and DUT− terminals, and the resistor may be configurable in the range 0.1 Ohm to 1 MOhm. The apparatus may then be configured for an automatic measurement of impedances between any two terminals of a three port device attached to the instrument. Such automatic measurement of impedances between any two terminals of a three port device attached to the instrument where the DC voltage across same terminals may be in the range of +/−1000V.

The apparatus may also allow for measurements of impedances between the DUT+ and the DUT− terminals with a configurable DC load internal to the instrument attached to the terminals.

The apparatus may also allow for measurement of DC voltages on all DUT terminals towards instrument ground.

The apparatus may also allow for measurements of DC voltages on all DUT terminals towards instrument ground, where the measurement is carried out across independently configurable resistive loads placed between instrument terminals and instrument ground.

The apparatus may also allow for measurements of DC voltages of all DUT terminals towards instrument ground, where the measurement is carried out across independently configurable resistive loads placed between instrument terminals and instrument ground and where the measurements are collected for at least two different configurations of the same resistive loads and afterwards analyzed to find resistive leakage between DUT terminals.

The apparatus may also allow for measurements of DC voltages on all DUT terminals towards instrument ground, where the measurement is carried out across independently configurable resistive loads placed between instrument terminals and instrument ground and where the measurements are collected for at least two different configurations of the same resistive loads and afterwards analyzed to find resistive leakage between DUT terminals In particular when the DUT is a PV system and the leakage resistance of interest is the isolation resistance towards system ground.

The apparatus may also allow for measurements of DC voltages of all DUT terminals towards instrument ground, where the measurement is carried out across independently configurable resistive loads placed between instrument terminals and instrument ground, and where the measurements are collected for at least two different configurations of the same resistive loads and afterwards analyzed to find resistive leakage between DUT terminals. In particular when the DUT is a PV system, and the leakage resistance is the isolation resistance. When the isolation resistance is found to be too low (typically <1 MOhm) and where the analysis is carried out to position the leakage to a single location in the PV system.

The apparatus may also allow for measurement of DC voltages of all DUT terminals towards instrument ground, where the measurement is carried out across independently configurable resistive loads placed between instrument terminals and instrument ground and with the configurable DC load internal to the instrument attached between the DUT+ and DUT− terminals.

The apparatus may also allow for measurements of DC voltages on all DUT terminals towards instrument ground, where the measurement is carried out across independently configurable resistive loads placed between instrument terminals and instrument ground and with the configurable DC load internal to the instrument attached between the DUT+ and DUT− terminals and with the purpose to collect several points on the IV curve for the DUT.

The apparatus may also allow for a combined measurement of impedances between the DUT+ and the DUT− terminals and of the DC voltages on all DUT terminals with a configurable DC load internal to the instrument attached between the DUT+ and the DUT− terminals, and where the load is considered to be 'weak', which may be in the range of 0-100 mA of current being drawn.

The apparatus may also allow for a combined measurement of impedances between the DUT+ and the DUT− terminals and of the DC voltages on all DUT terminals with a configurable DC load internal to the instrument attached between the DUT+ and the DUT− terminals and where the load is considered to be 'weak', which may be in the range of 0-100 mA of current being drawn, and where the purpose is to check for correct functionality of PV modules.

Thus the apparatus may be used for a multitude of measurements, which measurements individually or in combination allow for fault detection and localisation.

In an aspect the fault detection and localisation apparatus comprises a DC-source configured to generate a DC-test signal and be configured to apply the DC-test signal to the connector.

This DC-source may be an integrated part of the apparatus or unit within the apparatus and may be configured to provide a DC-test signal to the DUT, which may be DC-sources connected in series.

This will allow for detection in circumstances were no or insufficient voltage is available on the DUT.

In an aspect the detection and localisation apparatus electronic interface (212) is configured to be able to disconnect all terminals and the apparatus may be configured to self-test the AC-sources, DC-sources or both of the test signal, the detector and/or to self-test the comparator.

In an aspect of the detection and localisation the apparatus further comprises coupling capacitors that provide a capacitive coupling 40 type of coupling of terminals (14+, 14−, 16) to a DC-system.

In an aspect of the detection and localisation the electronic interface comprises individually configurable resistors ($R_1$, $R_2$) situated between the instrument ground and the positive and negative terminals respectively. Furthermore, a test resistor ($R_{TEST}$) is placed in between instrument ground and the system ground terminal.

This particular configuration allows for assessment of the distributed character of the leakage and may be used to guide the localisation and appropriate further assessments that may allow for a more local detection or to single out a fault and its localisation.

In an aspect of the detection and localisation apparatus at least the configurable resistors ($R_1$, $R_2$) are variable and optionally automatically variable.

This further eases the detection and may refine detection or allow for reuse of previous assessments based on the particular configuration of the DUT.

In an aspect of the detection and localisation apparatus, the comparator is configured to compare the response signal (24) and the test signal (22) by means of impedance spectroscopy (142).

This may allow for the advantages of detections or localisations based on the use of impedance spectroscopy disclosed either in WO2012152284, which is hereby incorporated by reference, or in this document.

In an aspect of the detection and localisation the apparatus is configured to perform
   a first assessment of the distributed nature of leakage to ground by establishing an estimate of the total leakage to ground, $R_{ISO}$, using at least two sets of values of the configurable resistors (R1, R2) and the test resistor ($R_{TEST}$) to functionally estimate the distributed nature of ground faults ($R_{ISO1}$, $R_{ISO2}$, . . . $R_{ISON+1}$) and conditionally to perform
   a second assessment of a first voltage ($V_1$) and a second voltage ($V_2$) dividing the string of serially connected DC-sources (12)
and to single out the location of a predominant ground fault ($R_{ISO}$).

A person skilled in the art will then be able to implement the required functions and to be guided through the assessment procedure.

At first, an assessment may be a measurement of the voltages referenced to the instrument/apparatus ground potential on the positive and negative poles of the DUT such as DC system-source comprising a number of serially connected individual DC-sources and of the DC system ground reference.

These voltages may be measured across at least two different configurations of variable resistors $R_1/R_2$ and $R_{TEST}$ and used to first compute the total ground isolation resistance ($R_{ISO}$) of the DC system-source and conditionally to perform a second assessment.

Thus first, the assessment may result in an estimate of the total $R_{ISO}$. If this estimate is below a certain value, it may make sense to perform a second assessment on this condition. For typical PV-installations, an $R_{ISO}$ value less than 1 MOhm may be a condition to perform the second assessment.

Secondly, an assessment may be an analysis of these voltages for the computation of a first voltage (V1) across a number of DC-source and a second voltage (V2) across the remaining DC-sources of the number of serially connected DC-sources (12) and thus to single out the location of a predominant ground fault ($R_{ISO}$).

The distribution of fault may be a "flat" distribution of equally critical faults or the distribution may "peak" to indicate a more localised distribution.

Likewise a person skilled in the art will be able to implement the required conditions to initiate the second assessment.

An object may also be achieved by a method of a fault detection and localisation of a fault in a DC-system comprising multiple serially connected DC-sources, which method comprises acts of:

a) connecting a test apparatus to at least one positive terminal and one negative terminal of the DC-system and to DC-system ground,
and as at least one repetition of:
b) applying a test AC-signal to at least one positive or negative terminal of the DC-system,
c) detecting the response AC-signal to the test AC-signal on either one positive or negative terminal alone or both and/or on DC-system ground;
d) comparing the response AC signal with the test AC-signal to detect a fault and the location of the fault in the DC-system.

In a particular aspect of the method of fault detection and localisation where there is an act of connecting at least two of the terminals using at least one switch in a multiplexer configuration to apply test signals and to receive response test-signals from all permutations of at least two of the terminals.

The method of fault detection and localisation may be advanced by an act of estimating the total leakage Riso using an electronic interface comprising individually configurable resistors ($R_1$, $R_2$) situated between the instrument ground and the positive and negative terminals and a test resistor ($R_{TEST}$) is placed in between instrument ground and the system ground terminal.

In particular there may an act of performing
a first assessment of the distributed nature of leakage to ground by establishing an estimate of the total leakage to ground ($R_{ISO}$) using at least two sets of values of the configurable resistors (R1, R2) and the test resistor ($R_{TEST}$) to functionally estimate the distributed nature of ground faults ($R_{ISO1}$, $R_{ISO2}$, . . . $R_{ISON+1}$) and conditionally an act of performing
a second assessment of a first voltage ($V_1$) and a second voltage ($V_2$) dividing the string of serially connected DC-sources to single out the location of a predominant ground fault ($R_{ISO}$).

Thus the method, or the apparatus, may generally be able to asses if the leakage to ground is normal and then "equally" or "evenly" distributed. This is obtained by performing two sets of measurements with different values of $R_1$, $R_2$ and $R_{TEST}$ that by algebraic equations known by the person skilled in the art results in an estimate of a total $R_{ISO}$. If this estimated total $R_{ISO}$ is "normal" or as expected due to always existing minor leakages, then the assessment may stop and indicate that there is no dominant leakage.

If the total $R_{ISO}$ is "smaller" than expected, then the leakage may be due to a dominant leakage or ground fault. Since the same methodology used to estimate total $R_{ISO}$ also yields a first voltage $V_1$ and a second voltage $V_2$ and then as a condition of the dominant leakage or ground fault being real, $V_1$ and $V_2$ divides the string and thus the location of the leakage can be found. For example, if $V_1$ equals $V_2$ and if the first assessment indicates a homogenous leakage, then the fault is located right in the middle of the string. A person skilled in the art may at least be able to estimate or improve the location of a ground fault and will appreciate differences or minor inhomogeneous leakages and correct for such.

DESCRIPTION OF THE DRAWING

The invention is described by example only and with reference to the drawings, whereon.

In the following text, the figures will be described one by one and the different parts and positions seen in the figures will be numbered with the same numbers in the different figures. Not all parts and positions indicated in a specific figure will necessarily be discussed together with that figure.

| Detailed Description of the Invention | |
|---|---|
| No | Item |
| 5 | Fault |
| 6 | Location |
| 10 | DC system |
| 11 | PV system |
| 12 | DC-source |
| 13 | PV-unit |
| 14 | Terminal |
| 14+ | Positive Terminal |
| 14− | Negative Terminal |
| 16 | DC-system ground |
| 22 | Test AC-signal |

-continued

Detailed Description of the Invention

| No | Item |
|---|---|
| 24 | Response AC-signal |
| 30 | Load |
| 32 | Weak load |
| 40 | Capacitive Coupling |
| 50 | Semiconductor fault |
| 51 | Diode |
| 52 | Diode fault |
| 53 | Connection |
| 54 | Connection fault |
| 55 | Ground (GND) |
| 56 | Ground fault |
| 57 | Cable |
| 58 | Cable fault |
| 100 | Method |
| 110 | Connecting |
| 115 | Repeating |
| 120 | Applying |
| 130 | Detecting |
| 132 | Impedance measurement |
| 140 | Comparing |
| 142 | Impedance spectroscopy |
| 150 | Stopping |
| 200 | A fault detection and localisation apparatus |
| 210 | Connector |
| 212 | Electronic interface |
| 214 | Switch |
| 220 | AC-source |
| 222 | DC-source |
| 230 | Detector |
| 240 | Comparator |

Figure 1:
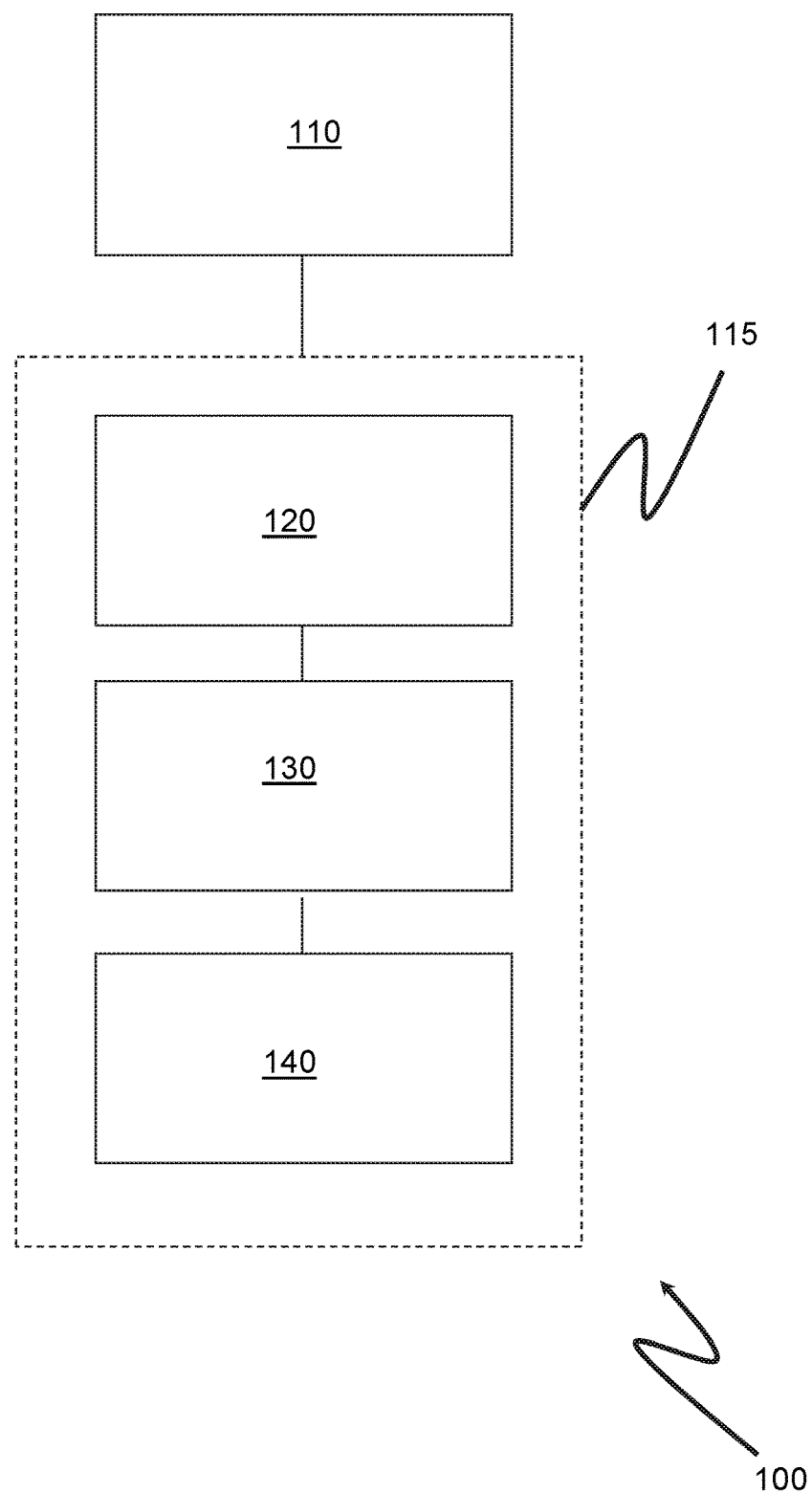
FIG. 1 illustrates acts of fault detection and localisation of a DC-system with multiple DC-sources.

FIG. 1 illustrates acts of fault detection and localisation 100 of a fault in a DC-system comprising multiple serially connected DC-sources. Disclosed is an act of connecting 110 a test apparatus to at least one terminal of the DC-system and to DC-system ground.

Thereafter there is an act of applying 120 a test AC-signal to the least one terminal of the DC-system, an act of detecting 130 the response AC-signal 24 to the test AC-signal on either one terminal alone and/or on DC-system ground, and an act of comparing 140 the test AC signal with the response AC-signal detect a fault and the location of the fault in the DC-system.

The mentioned features will become exemplified in the following figures.

Figure 2:
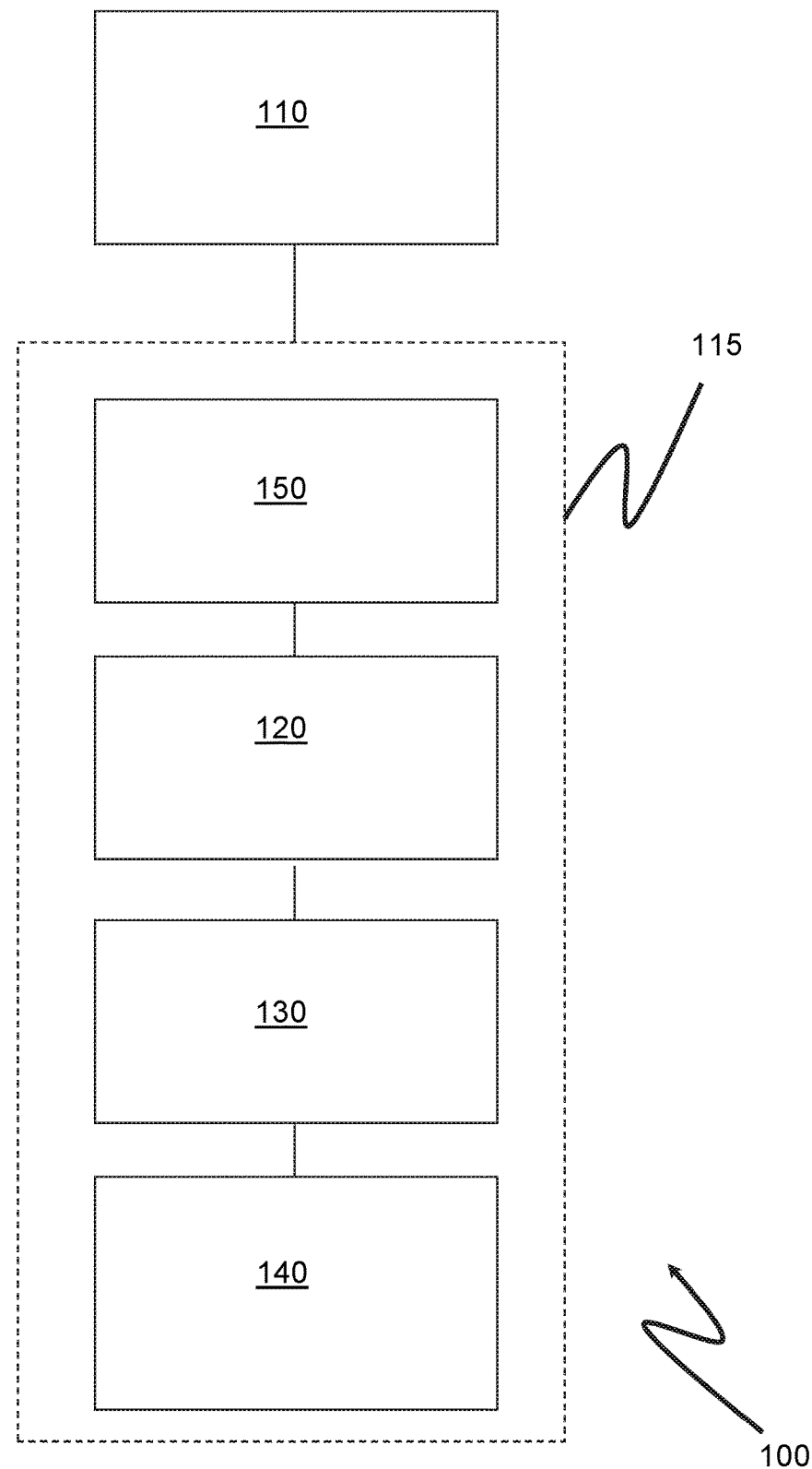
FIG. 2 illustrates a further act of stopping a DC-source

FIG. 2 illustrates in continuation a further act of stopping 150 at least one of the serially connected DC-sources. By stopping 150 is understood blocking, disconnecting, switching off or any other similar action that will stop the single source or unit from working.

Figure 3:
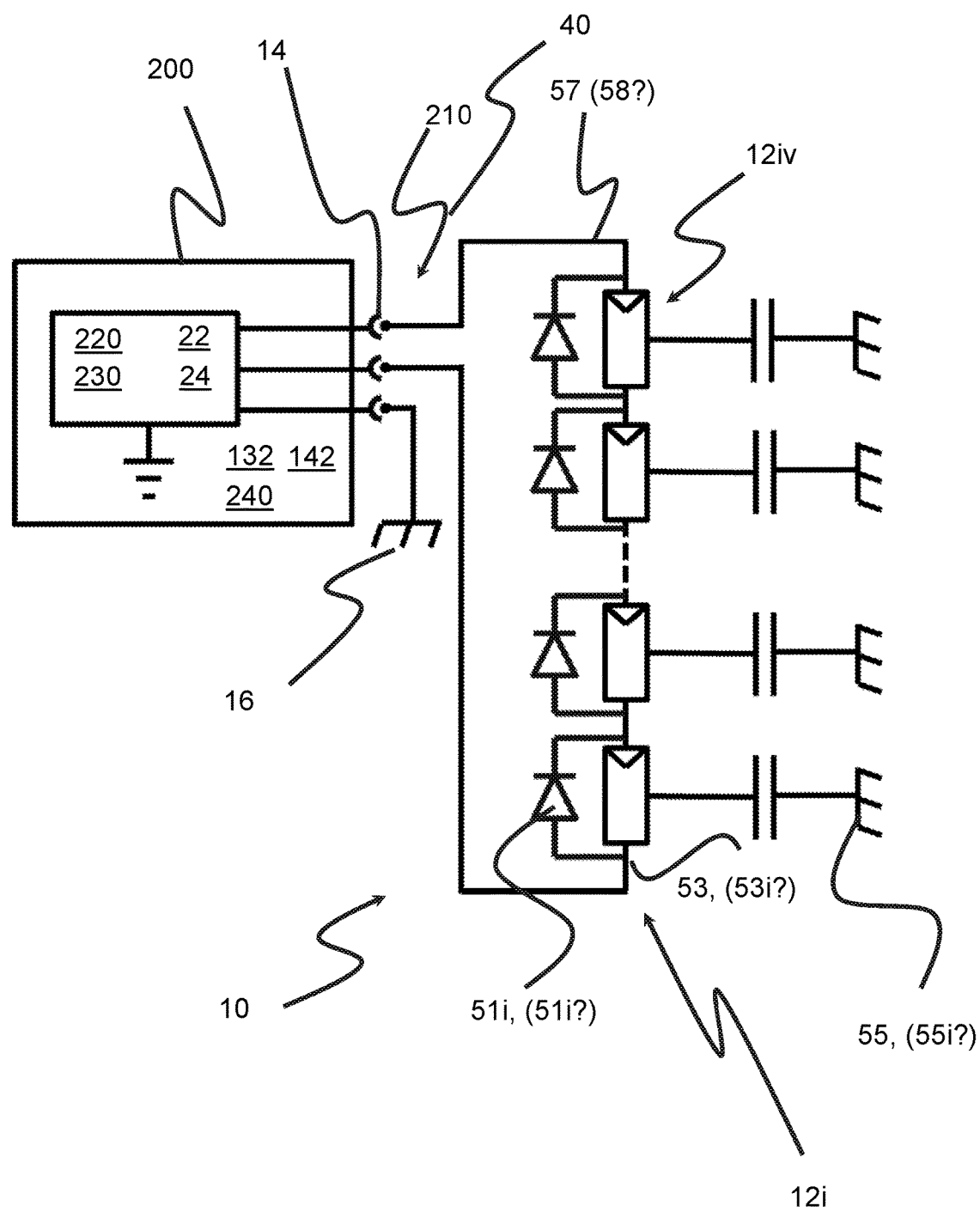
FIG. 3 illustrates an example situation where the apparatus for and method of fault detection and localisation is to be applied.

FIG. 3 illustrates an example situation where the method of fault detection and localisation 100 can be used and illustrates possible embodiments of the test apparatus 10 or a fault detection and localisation apparatus 200 that can be used.

The fault detection and localisation apparatus 200 for detection and localisation of a fault in a DC-system 10 comprising multiple serially connected DC-sources 12. Here illustrated as 12*i*, . . . , 12*iv*.

The fault detection and localisation apparatus 200 comprises a connector 210 configured to connect the apparatus 200 to at least one terminal 14 of the DC-system 10 and to DC-system ground 16.

The connector 210 or the connection may be a capacitive coupling 40 type of coupling.

The apparatus 200 comprises an AC-source 220 configured to generate a test AC-signal 22 and configured to apply the test AC-signal 22 to the connector 210. The apparatus comprises a detector 230 configured to detect the response AC-signal 24 to the applied test AC-signal 22. This may be performed by means of an impedance measurement 132 providing a measurement suited for impedance spectroscopy 142.

The apparatus comprises a comparator 240 configured to compare the test AC-signal 22 and the response AC-signal 24 by means of impedance spectroscopy 142 and to output the result the detection of a fault 5 and the location 6 of the fault in the DC-system 10.

This particular example shows a healthy and non-faulty DC-system 10 of DC sources 12. Each DC source 12 is secured with a BPD 51 and with a capacitance to system ground which is assumed to vary very little in size across the different DC sources 12.

In case of typical industrial PV-systems 13 of PV-modules (each yielding ~250 Wp) this capacitance is in the order of 0.1-1 nF.

The system has its terminals and ground connected to the fault detection and localisation apparatus 200.

In the case of measuring on a string of PV panels, the apparatus 200 is typically connected to the terminals where the DC to AC inverter is normally attached.

In such systems there is typically several meters of cables 57 which may experience a cable fault 58, shown as to indicate that the fault 58 may or may not be present. The cables 57 are often placed underground from the converter to the installation of the string of PV modules.

The cable 57 also has a capacitance towards ground that needs to be factored into the computations of typically 10-100 pF/meter.

The BPDs 51*i* function to protect DC sources 12 that are not producing power e.g. a string of PV panels that is partially shaded.

Figure 4:
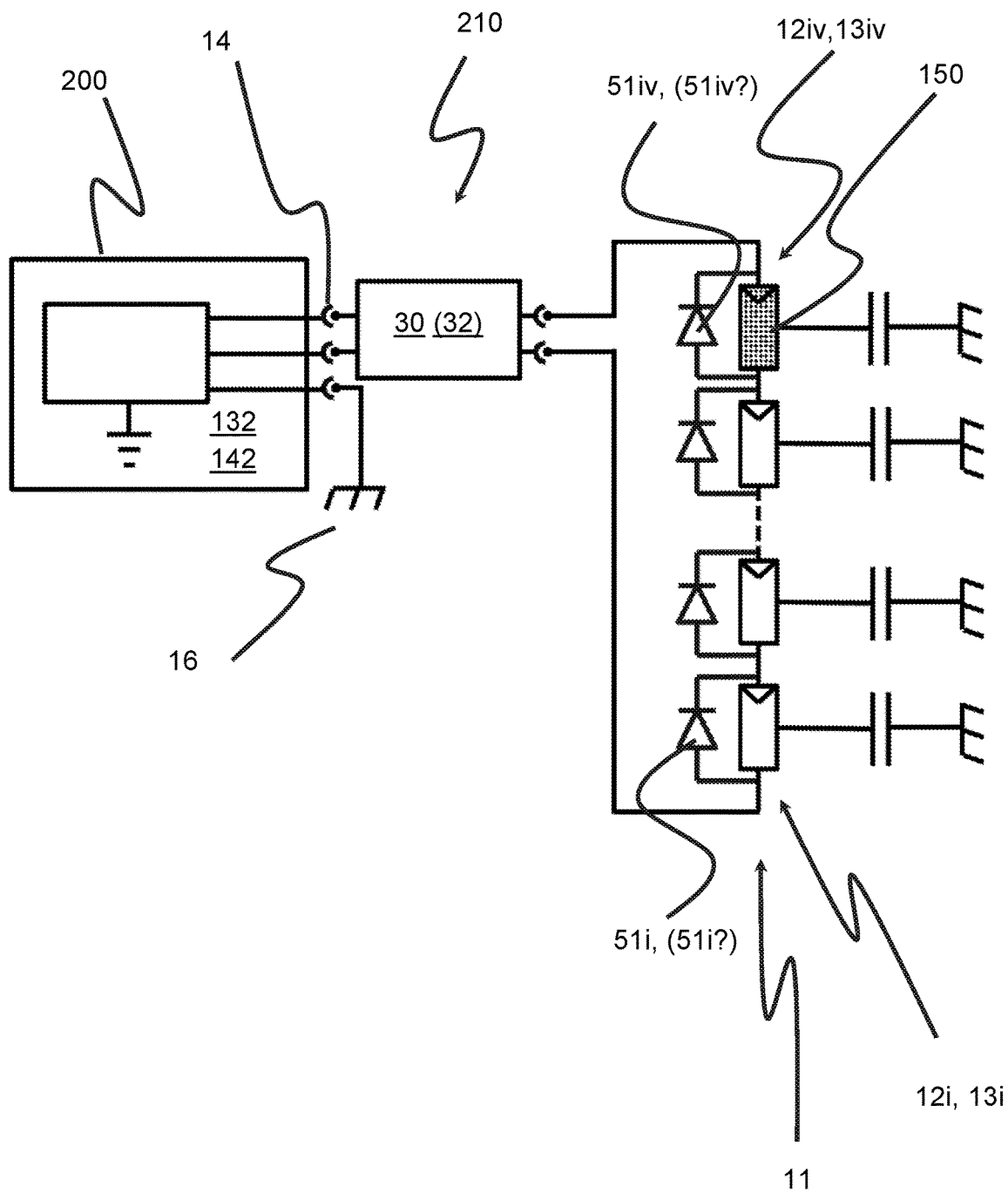
FIG. 4 illustrates an example situation where the apparatus for and method of fault detection and localisation is to be applied to with individual stopping of PV-modules to detect and locate a BPD fault.

FIG. 4 illustrates in continuation of the previous figures and with reference to essential numerals as necessary a load 30 or a weak load 32 has been placed across the terminals 14 of the series of DC sources 12 to ensure that a small direct current, say in the range 10 mA-100 mA is flowing through the system.

The load 30 or weak load 32 may be an integral part of the system. Alternatively the load 30 or weak load 32 may be supplied as one or more inserts.

As a result, the functionality of the BPD 51 can be checked by sequentially stopping 150, disconnecting or blocking one DC source 12 at a time and monitoring the change in measured impedance 132 across the terminals 14 of the system of serially connected DC sources 12*i*, . . . 12*iv*.

If there is little or no change in the impedance, the current in the DC source 12*iv* that has been stopped and must flow through the associated BPD 51*iv* thus turning it ON and creating a low-impedance path around the stopped 150 DC source 12*iv*, which in this case is a PV-unit 13*iv*.

In the case where the DC system 10 comprises a plurality of PV-units 13 or panels 13, the act of stopping 150 a single DC source 12*i* could be done by shading a panel or parts of a panel associated with the single BPD 51*i* that is being tested.

In one configuration each panel may have its cells divided in 3 sub-strings each protected by their own BPD. The illustration thus shows such sub strings and not entire panels.

Figure 5:
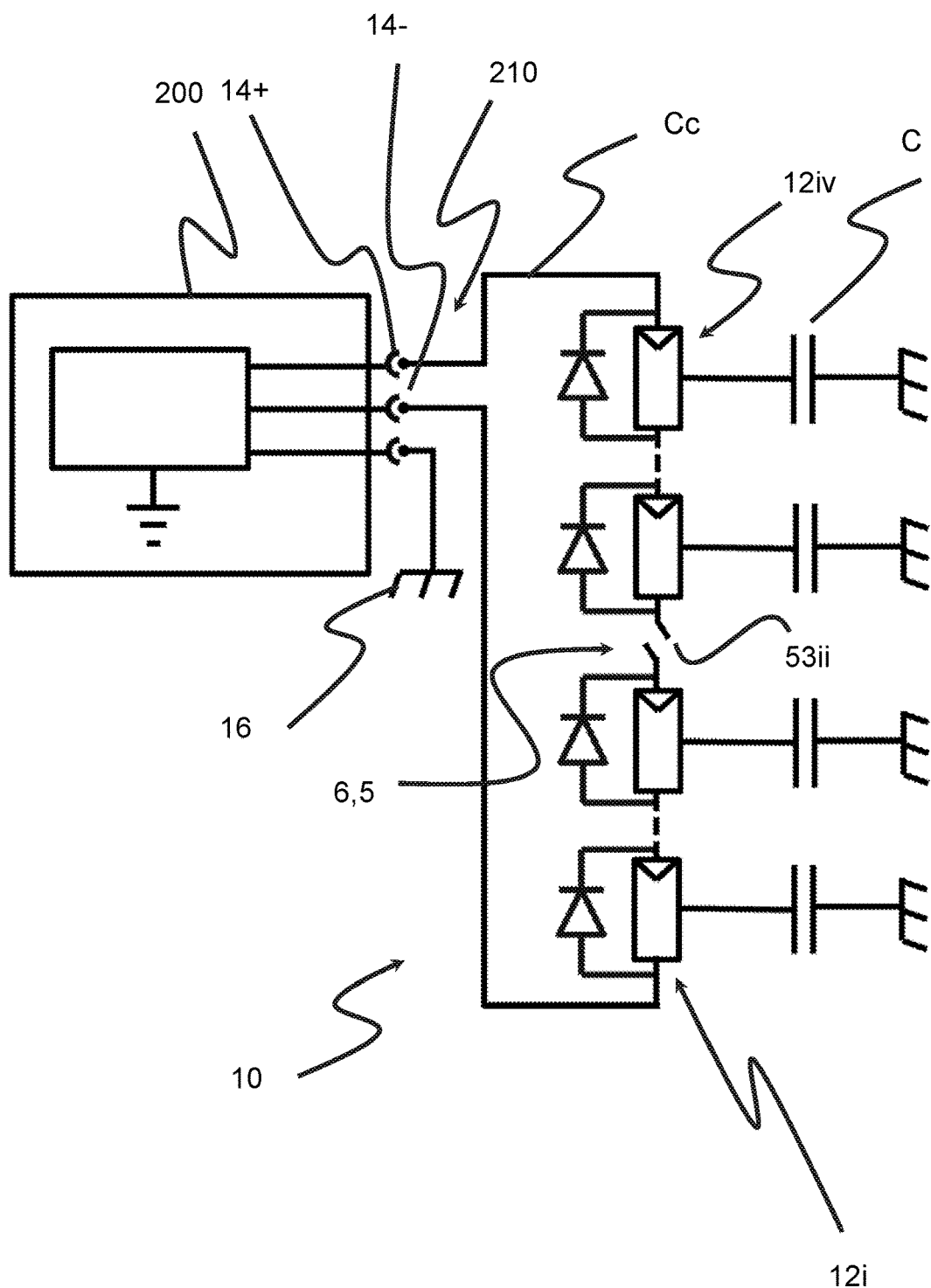
FIG. 5 illustrates an example situation where the apparatus for and method of fault detection and localisation is to be applied to detect and locate a connection fault.

FIG. 5 illustrates in continuation of FIG. 3 a serial disconnection 53 series disconnect in the string of DC sources 12. In this connection the disconnection 53 is between DC-sources 12*ii* and 12*iii*.

In order to locate 6 the disconnection 53, two measurements are carried out: First, the impedance measurement 132 from the positive terminal 14+ to ground 16 is measured and the capacitance to ground 16 or GND 16 is found (C+).

Next, the impedance from the negative terminal 14 and to ground 16 is found and similarly C− is computed.

Let n1 and n2 be the number of modules or sources 12 above and below the disconnect in the figure, respectively or the number of modules 12 between the positive terminal 14+ and the disconnection 53 and the number of modules 12 between the negative terminal 14− and the disconnection, respectively. Let N be the total number of modules. C is the capacitance to GND from a single source 12 (e.g. a PV panel) and Cc is the capacitance from the cables going to the instrument.

Using this circuitry model, the following three equations can be formulated:

$$N = n1 + n2$$

$$C+ = n1 \times C + Cc$$

$$C- = n2 \times C + Cc$$

Assuming that detecting 130 the capacitance from the cables (Cc) and verified that both C+ and C− are bigger than Cc so that the disconnection 53 is not somewhere in the cabling between the string of DC sources 12 and the test apparatus 200, n1 can now be found:

$$n1 = N \times (C+ - Cc)/(C- + C+ - 2 \times Cc)$$

Thereby the position or location 6 of the fault 5 being a disconnection 53 is found.

Figure 6:
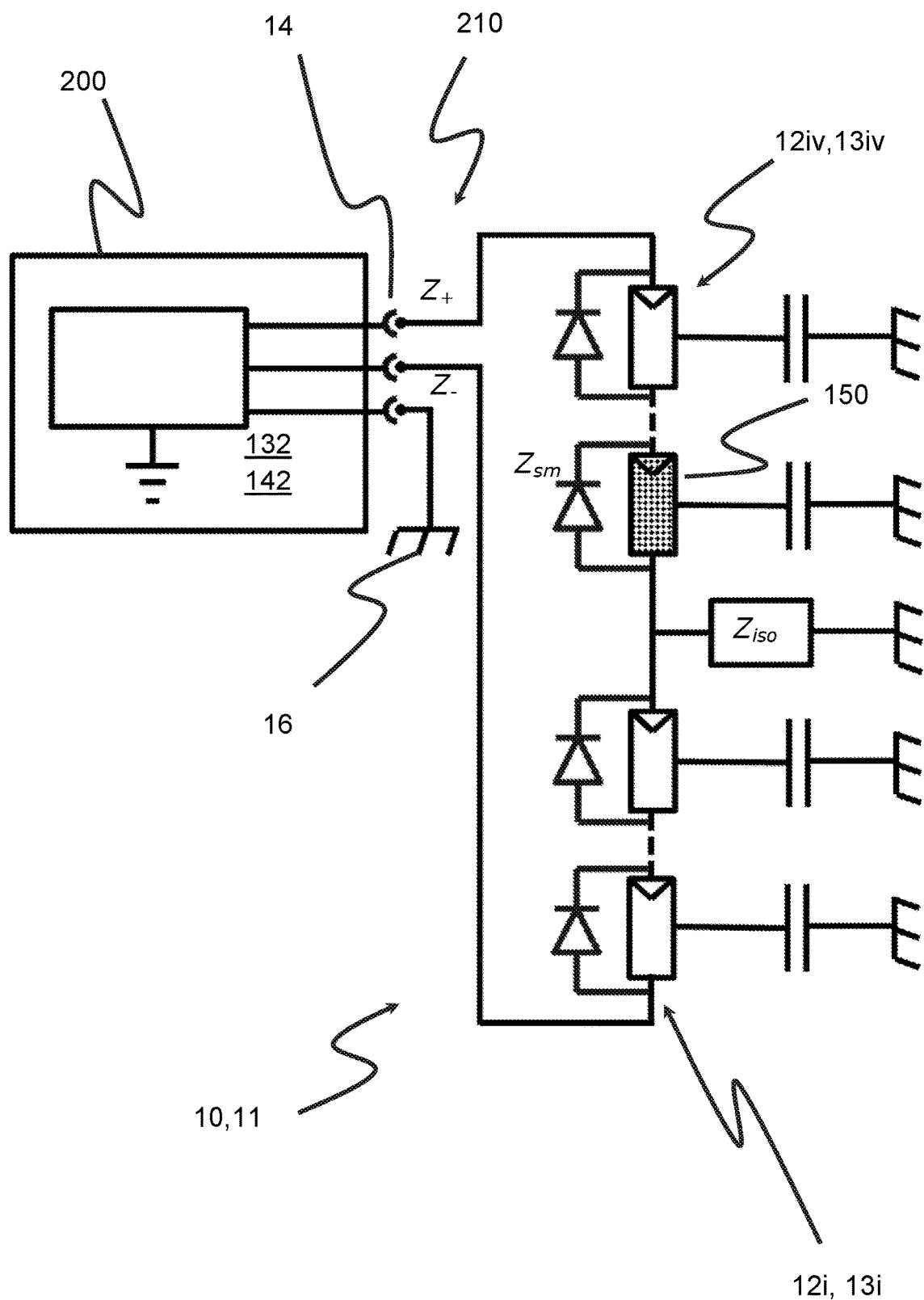
FIG. 6 illustrates an example situation where the apparatus for and method of fault detection and localisation is to be applied to detect and locate a ground fault.

FIG. 6 illustrates, also in view of the FIG. 3, a fault 5 being an isolation fault 54 having an impedance of Ziso and being located 6 somewhere in the string of DC sources 12. Such connection fault 54 is present and may be located by using the test apparatus 200 and method 100 disclosed. The detection is performed by several repeated 115 impedance measurements 142 from the both of the terminals 14 of the system 200 towards ground 16 whilst stopping 150 one DC source 12$i$ at a time.

In this case DC system 10 is a PV system 11, where stopping 150 a DC source 12 is performed by shading one of the PV panels 13. Using this circuitry model, the impedance measured 132 from the positive terminal 14+ and towards ground 16 is Z+:

$$Z+ = Ziso + Zsm$$

i.e. the sum of the isolation impedance (Ziso) and the impedance of the shaded PV module 13$ii$ (Zsm). Here, the impedance of the illuminated PV modules are comparatively much smaller than the impedance of a shaded PV-module and has been omitted.

The impedance measured from the negative terminal 14− towards ground 16 according to this circuitry model is:

$$Z- = Ziso$$

The invention is not limited to the embodiments described herein, and may be modified or adapted without departing from the scope of the present invention as described in the patent claims below.

Figure 7:
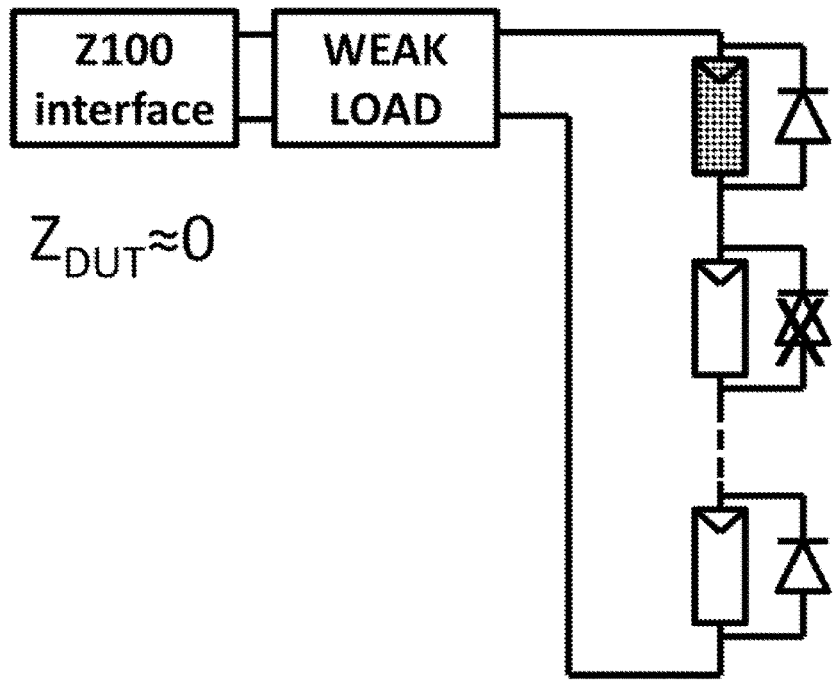
FIG. 7-9 illustrates exemplary usage of methods and systems as disclosed.
Figure 7:
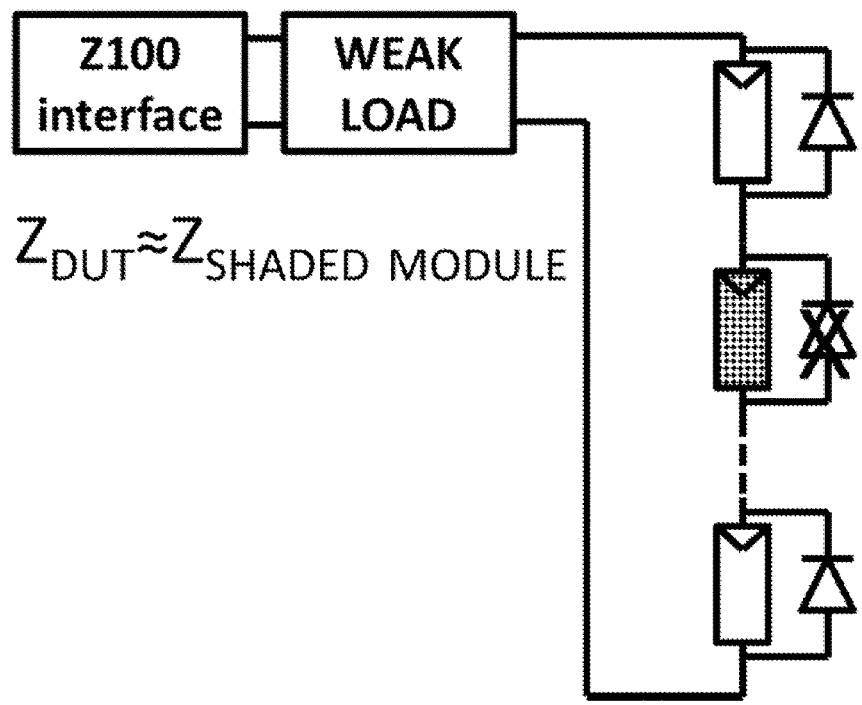
Figure 8:
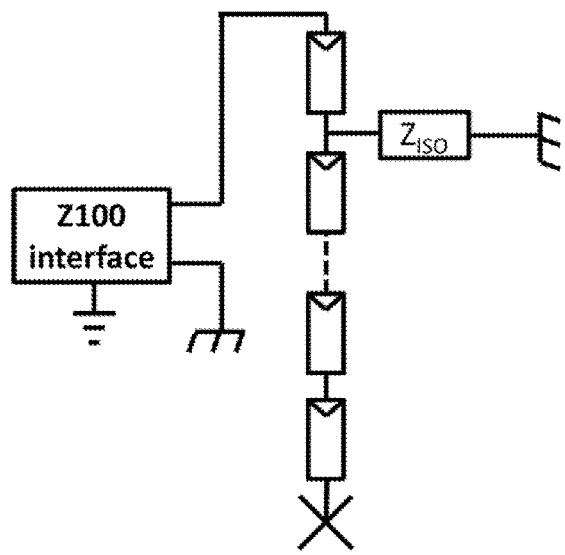
Figure 8:
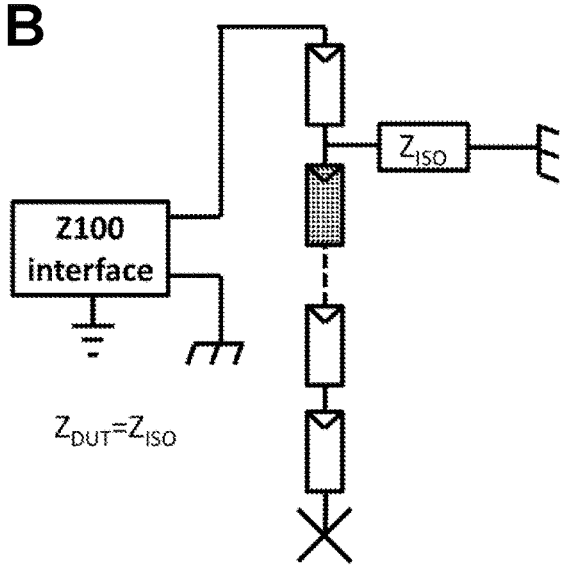
Figure 8:
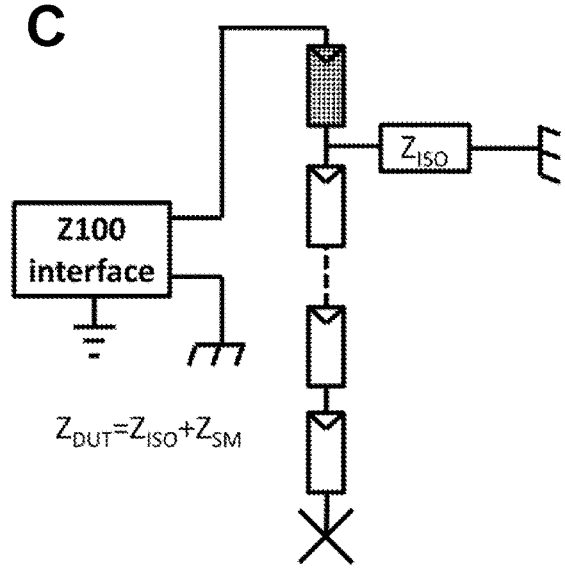
Figure 9:
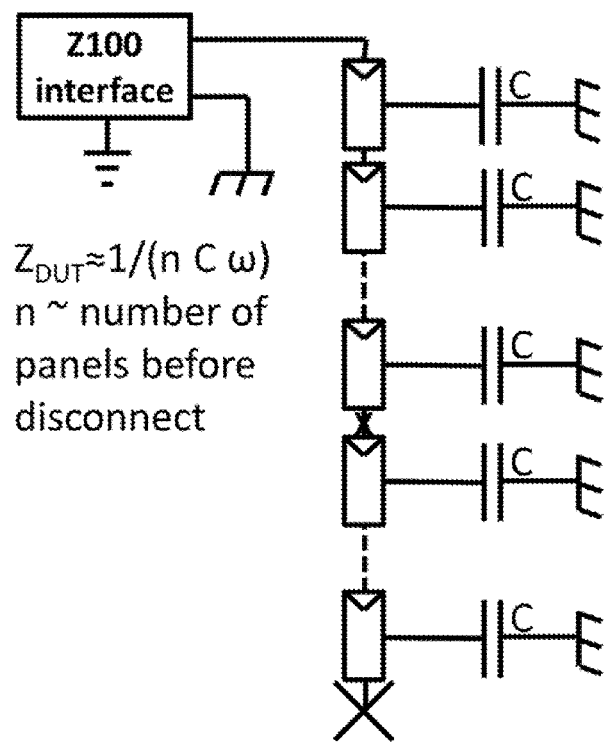
Figure 9:
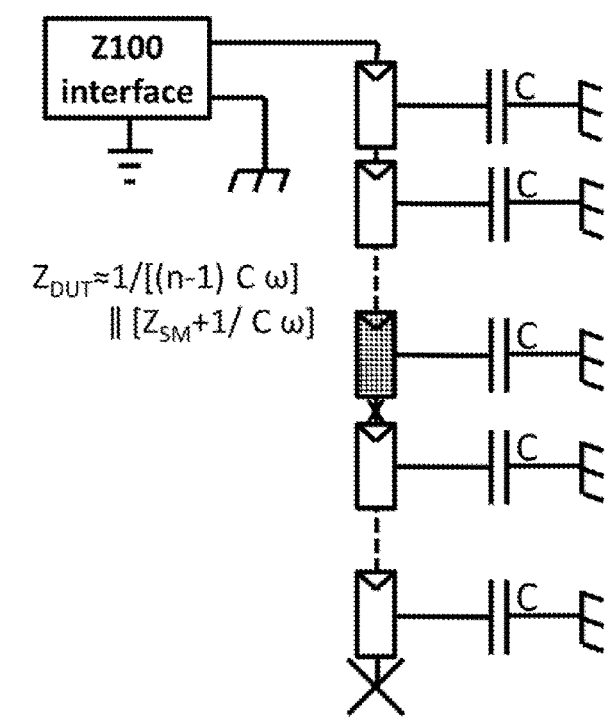

FIGS. 7 to 9 illustrate examples of usage of systems or methods as disclosed.

In the figures Z100 refers to fault detection and localisation apparatus or impedance meter to be made available by the applicant (EmaZys Technologies ApS). Z100 is a low voltage electronic instrument, and the AC test signals applied a given Device Under Test (DUT) in order to perform the impedance measurement are small in voltage, e.g. 1V peak to peak. It is not a trivial task to uncouple these small signals across a DUT where high voltages occur, e.g. 1000VDC.

However using a method or system as disclosed by which coupling to DUT is made with capacitors will allow uncoupling of the small signals. The capacitive coupling will shield the low voltage electronics against large DC currents and low frequency AC currents from DUT. There is further protection (by means of Zener diodes and power resistors) against the transient and potentially destructive currents running in the capacitors during connecting of the Z100 instrument with the DUT.

The fact that AC coupling to DUT implies an advantage, compared with existing DC methods as e.g. recording of DC-IV curves. For example, we can find the impedance of the PV panels under open circuit (OC) conditions where e.g. the BPDs are not switched on. With the presently used DC methods for detecting the state of health in the PV line, for e.g. shaded PV panels the BPDs will immediately be switched on when an IV characterization is performed, thereby reducing the impression of e.g. dirt on the PV panels.

With the possibility of drawing a small DC current the Z100 equipment provides an option to distinguish between different types of faults in the PV line. For example, there may be distinguished between a resistive fault arising e.g. as corrosion in cable connectors and a resistive fault arising as corrosion inside a PV panel just by performing an impedance measurement under OC conditions and then compare with a measurement performed where the small DC current is drawn.

FIG. 7 illustrates measuring configurations of multiple PV panels each with a BPD and a situation where the centre BPD is faulty. The fault detection and localisation is performed by repeatedly blocking (shading) a PV panel and for each blocking performing an impedance measurement as outlined and thereby detecting the BPD fault and its location.

BPDs are located in the individual PV panels, protecting the panel against the rest of the PV system forcing current through its solar cells if the panel is not illuminated. The current will in that case 'bypass' the solar cells and instead go through these BPDs.

However, a frequently occurring fault in PV systems is that the BPDs are burned and thereby no longer protect the panel. This may cause reduced power production by the PV system and hotspots, delamination and glass cracking in the affected module. These faults can furthermore cause electric arcs and thereby fire hazard to installation equipment and persons in the vicinity of the installation, e.g. residents in a house with the PV system mounted on the roof.

There is developed a technology that can detect if a burned diode is present at a point in a PV string. This is done at night by means of applying DC bias and measuring the resulting current flowing through the BPDs as a function of applied voltage. A technology for localizing a module with burned BPD has also been developed. It takes only a few seconds to move the shade from panel to panel in a PV line and similarly it takes about 1 second to measure the impedance spectrum with Z100. An entire line can hereby be checked in about 1 minute, which is a significant improvement as compared with isolating each single panel in the line and to perform a DC measurement for each panel in the direction of passage of the BPDs. This task will, depending on the type of installation, take 5-20 minutes per panel and furthermore require presence in person right at the panel.

This is sometimes a work operation by itself if the panels e.g. are mounted on a sloping roof. The present method only requires application of shade which e.g. can be made from the ground by using a shade mounted on a telescopic rod.

FIGS. 8A, B and C relate to PV systems with ground faults. The fault detection and localisation is performed by repeatedly blocking (shading) a PV panel and for each blocking performing an impedance measurement as outlined.

PV systems, ground faults may occur in many places and are a frequent source of hazard and circuit interruption. The latter typically causes the electricity generation to stop completely. Typically, the PV panels are mounted on earthed metal stands, cables run in earthed metal rails and the PV frames are most often earthed as well. For safety reasons, the inverter measures the degree of insulation (Riso), and it is required that the leakage current through Riso is measured and kept below a maximum level, e.g. 300 mA; 1 kOhm/V and at least 500 kOhm total.

Riso is typically more than 1 MOhm but e.g. ageing and crack formation in cable insulation material will reduce the degree of insulation. Besides, rupture in the cable insulation may occur during system mounting or caused by the activity of rodents, e.g. squirrels.

By an impedance meter (as disclosed in WO2012152284), we can measure the insulation impedance in the indicated way and thereby detect a new type of fault at line level. In the draft the positive pole of the PV line connected to the positive terminal on Z100, and the negative pole is floating. The positive pole could float as well. The negative terminal of Z100 is coupled to earth of the PV system, e.g. at the inverter or by a cable fitted to a scaffolding. By daylight, the measured impedance ZDUT will be equal to the insulation impedance and the impedance from the modules that may be arranged in series: $Z_{DUT} = Z_{ISO} \pm Z_{PV}$.

By AC coupling there is furthermore provided the possibility of localising where in the line the ground fault has appeared. By applying a shade on the PV panels one by one it can be seen which modules that are serially connected with ZISO, and which are not, and by observing the place where the DUT impedance changes when the shade is moved, it can be ascertained that the ground fault is there.

An apparatus may, besides the previously mentioned AC/impedance spectroscopy methods, be used to perform two other methods for localising the fault.

One uses the same method as described above and is used by inverters. The method requires alternatingly uncoupling the negative pole and the positive PV pole, respectively, from the Z100 instrument and instead connecting the GND terminal of the PV system. In each case the potential difference is measured across an about 1 MOhm resistance to earth on the poles of the PV line. These voltages are logged and the mentioned equations are solved, and then the technician is given information about the size as well as the position of the fault. Entirely without any use of shade!

The other method uses the DC-IV (IV: current-potential) measuring function by which the IV curve of the PV string is normally measured. Instead one of the poles, e.g. the negative pole and earth are connected to the instrument. When the user has connected the cables, the GO button is pressed, and the measurement is initiated in that the positive pole is drawn right down on the negative terminal of the instrument (in this case earth) via a large discharged capacitor with capacitance C. This capacitor will now be slowly charged with a time constant 'tau' determined by: tau=Riso× C. During the charging, the potential across the terminals of Z100 (in this case from positive PV pole to earth) and the active charging current are measured. By observing the slope at the start of the charging procedure of the voltage versus time, the magnitude of the Riso insulation resistance is determined. When the capacitor is fully charged, no current is running in Riso, and the final voltage measured on the positive pole in relation to earth reflects the number of panels present between the position of the ground fault and the positive terminal on the instrument. For example, if about 300V is measured, a sun irradiance of >100V/m2 is seen, and each panel delivers 60V, then the technicians are walk a distance of 300V/60V per panel, i.e. a distance of 5 panels back in the line from the positive pole. This is the location of the fault.

The latter method can of course be made independent of the voltage across the individual panel just by indicating the number of panels in the line and to perform a corresponding measurement as before where the negative PV line pole is coupled to the negative terminal on the instrument, but the positive PV line pole is allowed to float and the positive terminal on the instrument is coupled to the earth reference of the PV line.

FIGS. 9A and B relates to PV systems with faulty cables. The fault detection and localisation is performed by repeatedly blocking (shading) a PV panel and for each blocking performing an impedance measurement as outlined.

PV systems are located in the outdoors and are impacted by wind and weather through many years, a fact that limits the service lifetime and the capacity of the system. There are a number of potential factors that may accelerate the development—pests may e.g. begin to gnaw in the cables and it may also be envisaged that cables are compromised during installation of the system (e.g. pinched cable) or that guidelines for the cabling have not been followed, and that e.g. too small bending radii have been applied on the cables as compared with the guidelines of the producer.

Thus there are a number of factors that can cause cables to be broken over time. It is also possible to envisage a scenario where the conductivity of the cable is gradually reduced, but this process is accelerated by the fact that reduced conductivity leads to greater power dissipation at the point where the cable is already weak. Therefore, a cable will typically burn over immediately after the introduction of electrical resistance, which is due to the high power observed in typical PV lines (often several kW at peak). The opposite situation can be envisaged, if a conductor is automatically repaired by power dissipation as a kind of local heating, e.g. if the problem has arisen in a bad soldering.

It is thus one of the frequently occurring faults in PV installations, that an open connection arises somewhere in the PV line. The task of localizing the fault can be very time-consuming and will typically occur by examining all cable joints and silver circuits in modules.

Figure 10:
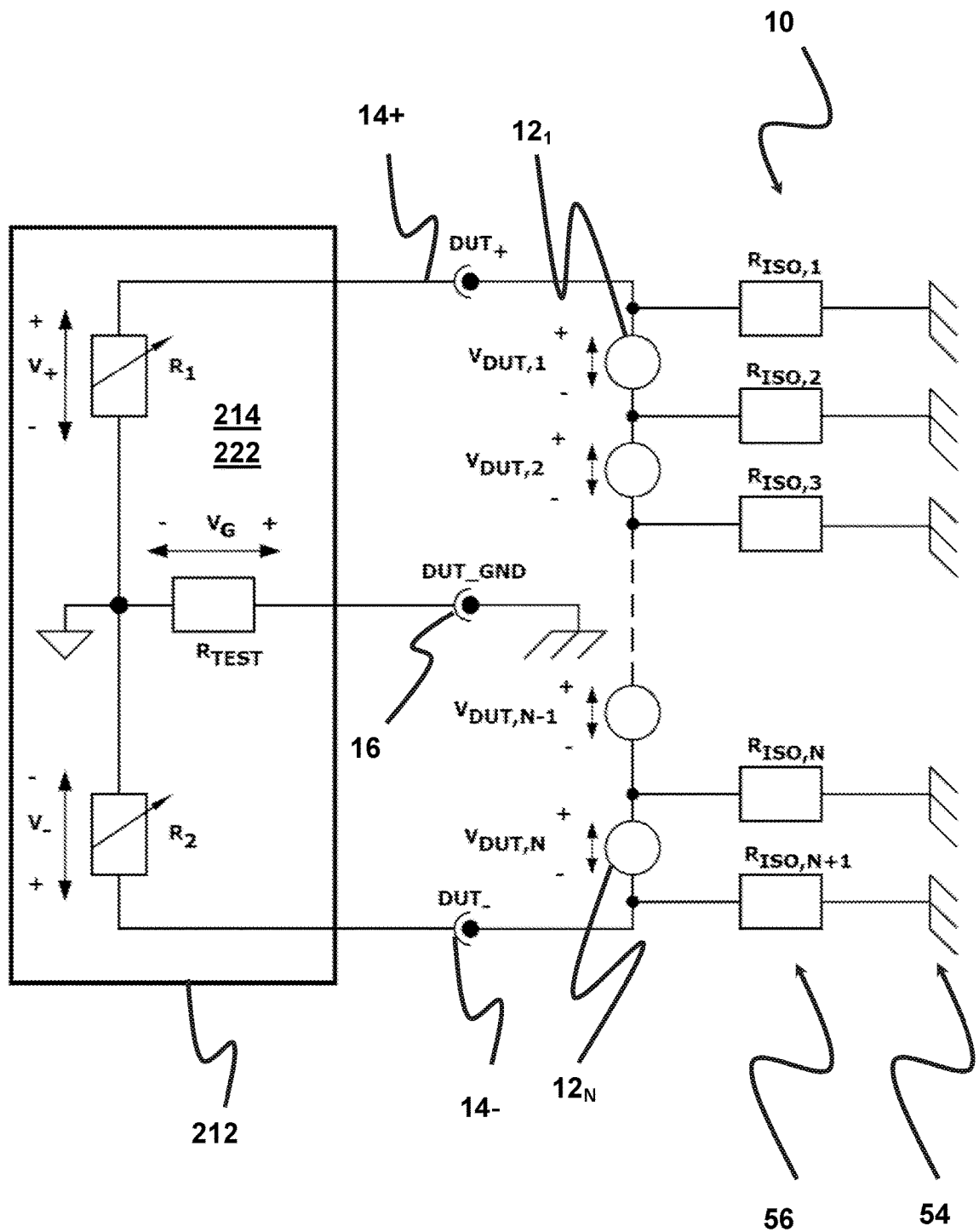
FIG. 10 illustrates a ground fault localisation method and apparatus setup with a number of voltage measurements to assess the distribution of faults.
Figure 11:
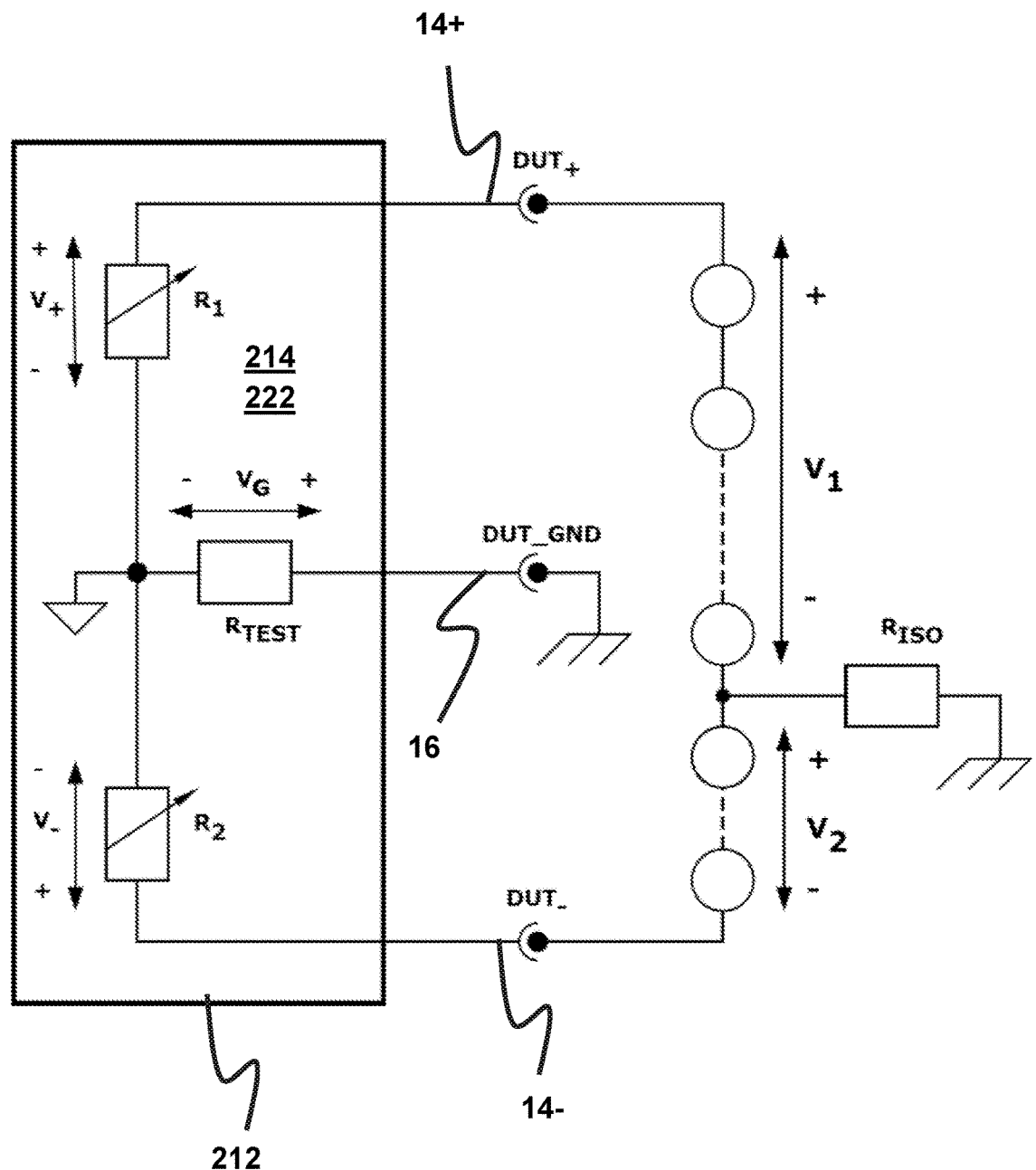
FIG. 11 illustrates a ground fault localisation method and apparatus setup with a number of voltage measurements to single out a fault.

FIG. 10 and in continuation FIG. 11 illustrate an electronic interface 212 with at least one switch 214 in a multiplexer configuration to apply test signals 22 and receive response AC-test-signals 24 from all permutations of at least two of the terminals 14+, 14−, 16. The terminals are termed DUT (Device Under Test).

This electronic interface 212 may be part of a fault detection and localisation apparatus 200 (not shown) for detection and localisation of a fault in a DC-system 10 comprising multiple serially connected DC-sources 12.

There may be individually configurable resistors (R1, R2) situated between the instrument ground and the positive and negative terminals 14+, 14− and a test resistor ($R_{TEST}$) is placed in between instrument ground 16 and the system ground terminal.

The detection and localisation the electronic interface comprises individually configurable resistors ($R_1$, $R_2$) situated between the instrument ground and the positive and negative terminals respectively. Furthermore, a test resistor ($R_{TEST}$) is placed in between instrument ground and the system ground terminal.

Optionally the fault detection and localisation apparatus 200 may comprise an internal a DC-source 222 configured to generate a DC-test signal 22 and configured to apply the DC-test signal 22 to the connector 210.

The illustrated configuration may be used as a fault detection and localisation apparatus 200 as disclosed and be configured to perform first an assessment of the distributed nature of ground faults by establishing an estimate of the total leakage $R_{ISO}$ using at least two sets of values of the configurable resistors ($R_1$, $R_2$) and the test resistor ($R_{TEST}$) to functionally estimate the distributed nature of ground faults ($R_{ISO1}$, $R_{ISO2}$, . . . $R_{ISON+1}$).

If the total $R_{ISO}$ is "smaller" than expected, then the leakage may be due to a dominant leakage or ground fault. On this condition an assessment of the first voltage ($V_1$) and a second voltage ($V_2$) shown in FIG. 11 will divide the string of serially connected DC-sources 12 and single out the location of a predominant ground fault ($R_{ISO}$).

Thus in summary FIG. 10 illustrates how a procedure can establish to assess if there is a singular fault. RTEST, R1 an R2 are connected to the terminals $DUT_+$, $DUT_-$ and $DUT_{GND}$. The voltages $V_+$, $V_-$ and $V_{GND}$ are shown at the respective resistors. $R_1$ an $R_2$ may be variable depending on the nature of the DUT. The individual DC sources are shown and at each of these a path to ground is illustrated across the different $R_{ISO}$ elements. The setup illustrates that grounding faults can be understood as the parallel combination of a number of leakages through the different RISO elements.

FIG. 11 illustrates a case where there is a single dominant fault i.e. the situation shown in FIG. 10 is reduced and simplified. $R_{TEST}$, $R_1$ an $R_2$ are (still) connected to the terminals $DUT_+$, $DUT_-$ and $DUT_{GND}$. The voltages $V_+$, $V_-$ and $V_{GND}$ are shown at the respective resistors. The individual DC sources are shown and a ground fault is now reduced to one single $R_{ISO}$ elements. The setup illustrates the how the location a grounding fault may be determined.

The invention claimed is:

1. A method of fault detection and localisation of a fault in a DC-system comprising multiple serially connected DC-sources, which method comprises acts of:
 a) connecting a test apparatus to at least one terminal of the DC-system and to DC-system ground,
 and as at least one repetition of:
 b) applying a test AC-signal to one terminal of the DC-system,
 c) detecting a response AC-signal to the test AC-signal on at least one of the one terminal and the DC-system ground;
 d) comparing the response AC signal with the test AC-signal to detect a fault and a location of the fault in the DC-system,
 wherein the act of comparing involves usage of impedance spectroscopy.

2. The method of fault detection and localisation according to claim 1, where the test AC-signal is a swept frequency.

3. The method of fault detection and localisation according to claim 1, wherein the DC-system is a PV-system and the DC-source is a PV-unit and wherein an act of stopping a single PV-unit comprises the act of blocking light to the PV-unit.

4. The method of fault detection and localisation according to claim 1, wherein the detected and localised fault is one or more fault selected from the list of of a semiconductor fault, a faulty diode, a connection fault, a disconnection fault, an isolation fault, a switching fault and a ground fault.

5. A fault detection and localisation apparatus for detection and localisation of a fault in a DC-system comprising multiple serially connected DC-sources, the fault detection and localisation apparatus comprising:
 a connector configured to connect the apparatus to at least one terminal of the DC-system and to DC-system ground;
 an AC-source configured to generate an test AC-signal and configured to apply the test AC-signal to the connector;
 a detector configured to detect a response AC-signal to the applied test AC-signal;
 a comparator configured to compare the response AC-signal and the test AC-signal by means of impedance spectroscopy and to output the result of the detection of a fault and a location of the fault in the DC-system.

6. The fault detection and localisation apparatus according to claim 5, wherein the connector is configured with an electronic interface with at least one switch in a multiplexer configuration to apply test AC-signals and to receive response AC-signals.

7. The fault detection and localisation apparatus according to claim 5, wherein the connector comprises coupling capacitors that provides a capacitive coupling of the terminals to a DC-system.

8. The fault detection and localisation apparatus according to claim 5, further configured for voltage measurements with individually configurable resistors arranged between the positive and negative terminals and in between is a test resistor to instrument ground.

9. The fault detection and localisation apparatus according to claim 5, further configured with means for measuring a number of voltages across the terminals of the DC-system.

10. The fault detection and localisation apparatus according to claim 5, wherein the apparatus is powered by a mobile power-source.

11. A fault detection and localisation apparatus for detection and localisation of a fault in a DC-system comprising multiple serially connected DC-sources, the fault detection and localisation apparatus comprising:
 a connector configured to connect the apparatus to at least one positive terminal and one negative terminal of the DC-system and to DC-system ground;
 an AC-source configured to generate an AC-test signal and configured to apply the AC-test signal to the connector;
 a detector configured to detect a response AC-test-signal to the applied test-signal;
 a comparator configured to compare the response test-signal and the test-signal and to output a result of the detection of a fault and a location of the fault in the DC-system,
 an electronic interface with at least one switch in a multiplexer configuration to apply test signals and receive response AC-test-signals from all permutations of at least two of the terminals.

12. The fault detection and localisation apparatus for detection and localisation of a fault in a DC-system according to claim 11 comprising a DC-source configured to generate a DC-test signal and configured to apply the DC-test signal to the connector.

13. The fault detection and localisation apparatus according to claim 11, comprising coupling capacitors that provide a capacitive coupling 40 type of coupling of terminals to a DC-system.

14. The fault detection and localisation apparatus according to claim 11, the electronic interface comprises individually configurable resistors situated between the instrument ground and the positive and negative terminals and a test resistor is placed in between instrument ground and the system ground terminal.

15. The fault detection and localisation apparatus according to claim 11, wherein the comparator is configured to compare the response signal and the test signal by means of impedance spectroscopy.

16. A method of fault detection and localisation of a fault in a DC-system comprising multiple serially connected DC-sources, which method comprises acts of:
   a) connecting a test apparatus to at least one positive terminal and one negative terminal of the DC-system and to DC-system ground,
   and at least one repetition of:
   b) applying a test AC-signal to at least one of said positive and negative terminal of the DC-system,
   c) detecting a response AC-signal to the test AC-signal on at least one of the said positive terminal, negative terminal and DC-system ground;
   d) comparing the response AC signal with the test AC-signal to detect a fault and a location of the fault in the DC-system.

17. The method of fault detection and localisation according to claim 16, comprising an act of connecting at least two of the terminals using at least one switch in a multiplexer configuration to apply test signals and to receive response test-signals from all permutations of at least two of the terminals.

18. The method of fault detection and localisation according to claim 16, comprising an act of estimating a total leakage $R_{ISO}$ using an electronic interface comprises individually configurable resistors situated between the instrument ground and the positive and negative terminals and a test resistor is placed in between instrument ground and the system ground terminal.

19. The method of fault detection and localisation according to claim 16, comprising an act of performing
   first an assessment of a distributed nature of leakage to ground by establishing an estimate of the total leakage to ground using at least two sets of values of the configurable resistors and the test resistor to functionally estimate the distributed nature of ground faults and conditionally an act of performing
   second an assessment of a first voltage and a second voltage dividing the string of serially connected DC-sources to single out the location of a predominant ground fault.

* * * * *